United States Patent [19]

Bonitz et al.

[11] Patent Number: 5,414,928
[45] Date of Patent: May 16, 1995

[54] METHOD OF MAKING AN ELECTRONIC PACKAGE ASSEMBLY WITH PROTECTIVE ENCAPSULANT MATERIAL

[75] Inventors: Barry A. Bonitz; James V. Ellerson, both of Endicott; Kishen N. Kapur, Vestal; Jack M. McCreary, Apalachin; Irving Memis, Vestal, all of N.Y.; Gerald M. Vettel, Pine Island, Minn.

[73] Assignee: International Business Machines Corporation, Armonk, N.Y.

[21] Appl. No.: 42,196

[22] Filed: Apr. 2, 1993

Related U.S. Application Data

[62] Division of Ser. No. 805,435, Dec. 11, 1991, abandoned.

[51] Int. Cl.$^6$ .................................... H05K 3/34
[52] U.S. Cl. ............................. 29/840; 29/841; 228/180.21; 228/214; 361/783; 257/684
[58] Field of Search ........................... 29/840, 841; 228/180.21, 214, 234.1 A; 361/783; 257/684

[56] References Cited

U.S. PATENT DOCUMENTS

| | | | |
|---|---|---|---|
| 4,238,528 | 12/1980 | Angelo et al. | 427/96 |
| 4,311,267 | 1/1982 | Lim | 29/840 |
| 4,604,644 | 8/1986 | Beckham et al. | 29/840 |
| 4,644,445 | 2/1987 | Sakuma . | |
| 4,825,284 | 4/1989 | Soga et al. . | |
| 4,830,922 | 5/1989 | Sparrowhawk et al. | 428/411.1 |
| 4,999,699 | 3/1991 | Christie et al. . | |

FOREIGN PATENT DOCUMENTS

| | | | |
|---|---|---|---|
| 60-46095 | 3/1985 | Japan . | |
| 62-45138 | 2/1987 | Japan | 29/841 |
| 63-143851 | 6/1988 | Japan | 257/684 |
| 1-72590 | 3/1989 | Japan | 228/180.21 |
| 0139465 | 10/1990 | Japan . | |
| 0382095 | 4/1991 | Japan . | |

OTHER PUBLICATIONS

IBM Tech. Discl. Bulletin, "Encapsulated Solder Joint for Chip Mounting" vol. 32, No. 10B, p. 480 Mar. 1990.
IBM Technical Disclosure Bulletin vol. 33, No. 10B, Mar. 1991, pp. 205–207, "Encapsulation Schemes For C4–Bonded Tab Packages", by Ameen et al.
"The Effects Of Thermal Cycle Stress On Potted SMT Circuit Card Assemblies", by R. M. Berg (date and journal unknown).

*Primary Examiner*—P. W. Echols
*Attorney, Agent, or Firm*—Lawrence R. Fraley

[57] ABSTRACT

An electronic package assembly wherein a low profile package is soldered to an organic (e.g., epoxy resin) substrate (e.g., printed circuit board), the projecting conductive leads of the package and the solder which substantially covers these leads (and respective conductors on the substrate) having been substantially covered with encapsulant material (e.g., polymer resin) to provide reinforcement for the solder-lead connections. The encapsulant material is dispensed about the solder and lead joints following solder reflow and solidification so as to substantially surround the solder and any portions of the leads not covered with solder. The invention has particular useful with thin, small outline package (TSOP) structures which occupy a minimum of height on the substrate surface.

9 Claims, 2 Drawing Sheets

METHOD OF MAKING AN ELECTRONIC PACKAGE ASSEMBLY WITH PROTECTIVE ENCAPSULANT MATERIAL

This is a divisional of application Ser. No. 07/805,435, filed Dec. 11, 1991, now abandoned.

TECHNICAL FIELD

The present invention relates to electronic packaging structures and particularly to such structures for use within information handling systems (computers). Even more particularly, the invention relates to such package assemblies wherein an electronic package is surface mounted on one of the assembly's organic substrates (e.g., printed circuit board).

CROSS-REFERENCE TO CO-PENDING APPLICATIONS

In Ser. No. (S.N.) 07/493,125, entitled, "Solder Interconnection Structure On Organic Substrates And Process For Making", filed Mar. 14, 1990 (co-inventors R. Hsiao et al), there is defined a solder interconnection structure for joining a semiconductor device (chip) to an organic substrate wherein the gap between the substrate and device is filled with a composition obtained from curing a thermosetting preparation which contains a thermosetting binder and filler having a maximum particle size of only about 50 microns. Ser. No. 07/493,125 is now U.S. Pat. No. 5,121,190, having issued Jun. 9, 1992.

In Ser. No. 07/782,701, entitled, "Reworkable Module And Method Of Fabricating The Module", filed Oct. 25, 1991 (co-inventors K. Grebe et al), now U.S. Pat. No. 5,274,913 there is defined the use of epoxy encapsulant material for being dispensed between a semiconductor device (chip) and organic substrates. In this application, reworkability of the encapsulant is attained by providing a passivating layer between the epoxy and substrate, which layer is removable (e.g., by reactive ion etching). Parylene and related compounds are utilized as the passivating layer. Ser. No. 07/782,701 is now U.S. Pat. No. 5,274,913, having issued Jan. 4, 1994.

Both of the above co-pending applications are assigned to the same assignee as the present invention.

BACKGROUND OF THE INVENTION

Electronic package assemblies which utilize various organic substrates (e.g., printed circuit boards comprised of epoxy resin or the like material) having one or more electronic packages surface mounted thereon are known. Typically, such electronic packages include a relatively flat housing component having therein at least one semiconductor device (chip), which semiconductor device is in turn electrically connected to various conductive leads (e.g., copper) which project from designated sides of the housing. One such example is known in the art as a dual in-line package (DIP). Such packages in turn provide various functions (e.g., memory, logic) for the overall system which utilizes package assemblies of this type. Typically, the conductive leads which project from these packages are electrically coupled to respective conductor pads (e.g., copper) or the like which may form the circuitry on an upper surface of the organic substrate. As is known, various solder compositions may be used to provide individual connections between respective pairs of leads and conductors.

Recently, there have been developed electronic packages of relatively low profile which in turn include an insulative housing of relatively thin construction. Such packages are referred to in the art as TSOP's, TSOP standing for thin, small outline package. Such devices, being thin, occupy a minimum of height on the respective organic substrate and are further capable of being surface mounted to the substrate's respective circuitry (e.g., conductor pads) using known (e.g., soldering) techniques. These relatively new packages are known to include memory chips as the semiconductor devices thereof, but may provide other functions (e.g., logic) if desired. Significantly, these recently developed packages are able to provide such functioning while assuring a compact, low profile, thus representing a substantial savings in space for the final product utilizing same.

It has been discovered that when such packages are surface mounted on organic substrates (and particularly those of epoxy resin dielectric material) of relatively thick configuration (e.g., greater than about 0.050 inches thick), relatively significant stress is placed on the solder-lead joints, which stress can in turn adversely effect such joints, possibly causing separation thereof. Such resulting separation in turn may cause disconnection between the lead and solder, possibly rendering the package partially inoperative. Such stress is caused during operation of the package as a result of relatively substantial differences in the coefficients of thermal expansion of the relatively thick organic substrate and the coefficients of expansion of various other elements (e.g., the conductive leads, solder and package housing). Such differences are even more pronounced when thicker organic substrates (e.g., those including several conductive layers therein which function as signal, power or ground planes) are utilized. Thicker substrates are often desired in the computer industry in order to provide additional functioning within a singular member.

It is believed, therefore, that an electronic package assembly which permits the utilization of electronic packages such as those of the TSOP variety to be effectively utilized on organic substrates, and particularly those substrates of relatively thick dimensions, would constitute a significant advancement in the art.

DISCLOSURE OF THE INVENTION

It is, therefore, a primary object of the present invention to enhance the electronic package assembly art.

It is another object of the invention to provide an electronic package assembly which obviates the aforementioned thermal stress problem.

It is yet another object of the invention to provide such a package which can be produced on a relatively large scale, to thus benefit from the several advantages (e.g., lower cost) associated therewith.

In accordance with one aspect of the invention, there is provided an electronic package assembly which comprises an organic substrate including a surface thereon having a plurality of electrical conductors positioned on the surface, an electronic package including an elongated insulative housing located on or above the substrate's surface and including first and second opposing sides which in turn each include a plurality of conductive leads projecting therefrom, individual quantities of solder for substantially covering respective pairs of one such lead and a respective conductor, and encapsulant material located on these quantities of solder for substantially covering the solder so as to substantially prevent electrical disconnection between the conductive leads and the solder during operation of the electronic package assembly.

In accordance with another embodiment of the invention, there is provided a method of making an electronic package assembly, which method comprises the steps of providing an organic substrate including a surface thereon having a plurality of electrical conductors located on the surface, positioning an electronic package having an elongated insulative housing with first and second opposing sides on or above the surface, each side having a plurality of electrically conductive leads projecting therefrom, the leads being electrically connected to respective ones of the conductors, substantially covering each pair of electrically connected lead and conductor members with a quantity of solder, and thereafter substantially covering the solder with encapsulant material, the encapsulant material serving to substantially prevent disconnection between the respective leads and solder during operation of the electronic package assembly.

BEST MODE FOR CARRYING OUT THE INVENTION

For a better understanding of the present invention, together with other and further objects, advantages and capabilities thereof, reference is made to the following disclosure and appended claims in connection with the above-described drawings.

Figure 1:
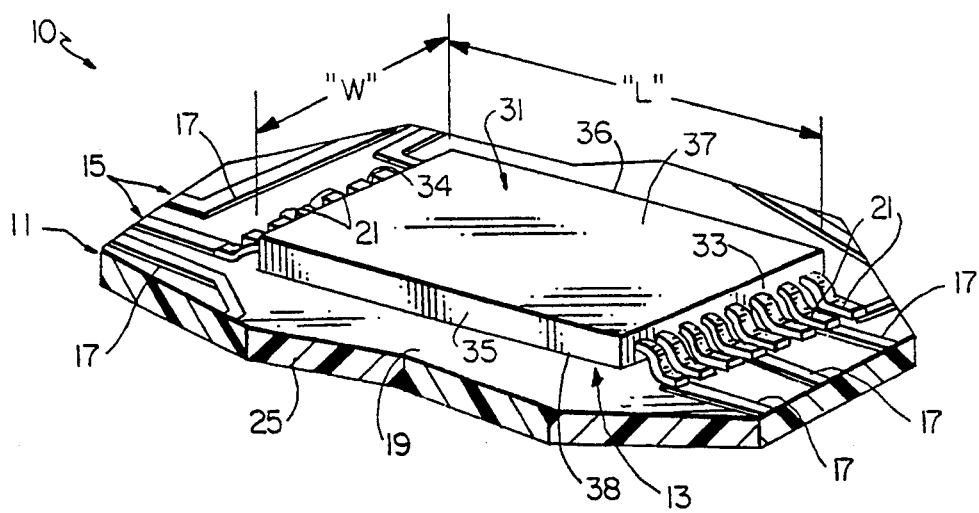
FIG. 1 is a partial perspective view of an electronic package assembly in accordance with one embodiment of the invention, prior to having encapsulant material added thereto.
Figure 3:
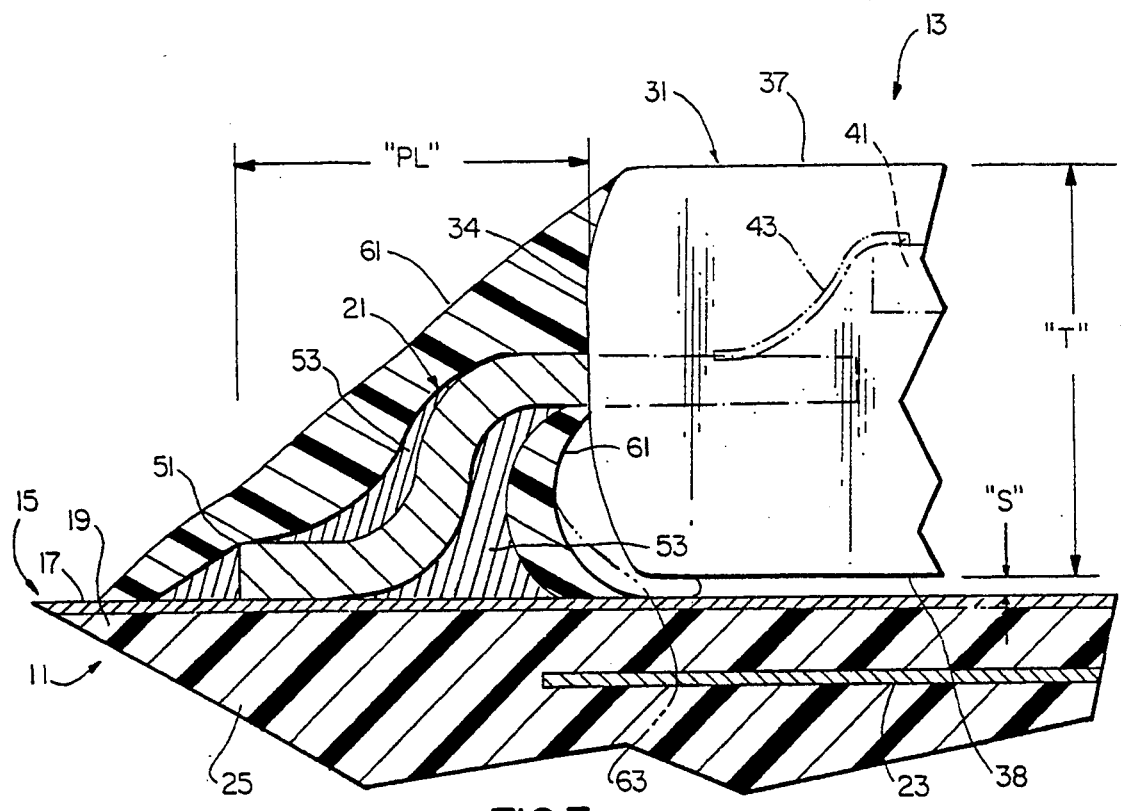
FIG. 3 is a partial elevational view, in section and on a much enlarged scale over the views in FIGS. 1 and 2, illustrating one of the sides of the invention's package having encapsulant located over the conductive leads projecting therefrom.

In FIG. 1, there is shown a partial view of an electronic package assembly 10 in accordance with a preferred embodiment of the invention. Package assembly 10 includes an organic substrate 11 and an electronic package 13 designed for being positioned on substrate 11 so as to be electrically connected to circuitry 15 thereof. Circuitry 15 is represented, illustratively, as a plurality of electrical conductors 17 located on an upper surface 19 of substrate 11. It is understood that package 13, which includes a plurality of electrically conductive leads 21 projecting from two opposing sides thereof, is designed for being positioned on substrate 11 such that each of the conductor leads 21 is in turn electrically connected to a respective one or more of the conductors 17. Only a few conductors 17 are shown, for illustrative purposes. It is further understood that each lead may be connected to other forms of conductors which may in turn form part of substrate 11, including plated-through-holes having appropriate land sections (not shown), which plated-through-holes are in turn electrically coupled to various internal conductors (e.g., signal, power or ground planes 23, as shown in FIG. 3). Such plated-through-holes, lands, and other conductors are typically comprised of sound conductive material (e.g., copper, chrome-copper-chrome, etc.) and are provided on a surface such as 19 or within substrate 11 in accordance with procedures known in the art and further description is thus not believed necessary.

Organic substrate 11 is preferably a multilayered printed circuit board having circuitry 15 located on its upper surface 19, the board comprised of a dielectric material 25 (see also FIGS. 2–4) of known composition. Preferably, this dielectric material is epoxy resin reinforced with fiberglass, also referred to in the industry as FR-4 material. In one example of the invention, substrate 11 may include a total of from about eight to ten individual conductive layers spacedly located within the substrate's dielectric, thereby assuring maximum operational capability for substrate 11. The invention is not limited to this number of conductive layers, however, in that other numbers (more or less) may be provided. Significantly, substrate 11 is of relatively thick construction (e.g., to accommodate the aforementioned several conductive layers). By the term relatively thick is meant to define an organic substrate having a thickness greater than about 0.050 inch. In one example of the invention, substrate 11 possessed a thickness of about 0.062 inch. The invention is not limited to use only with such thick substrates, however. The process defined herein has been successfully-utilized with substrates having a thickness as little as about 0.015 inch.

Figure 2:
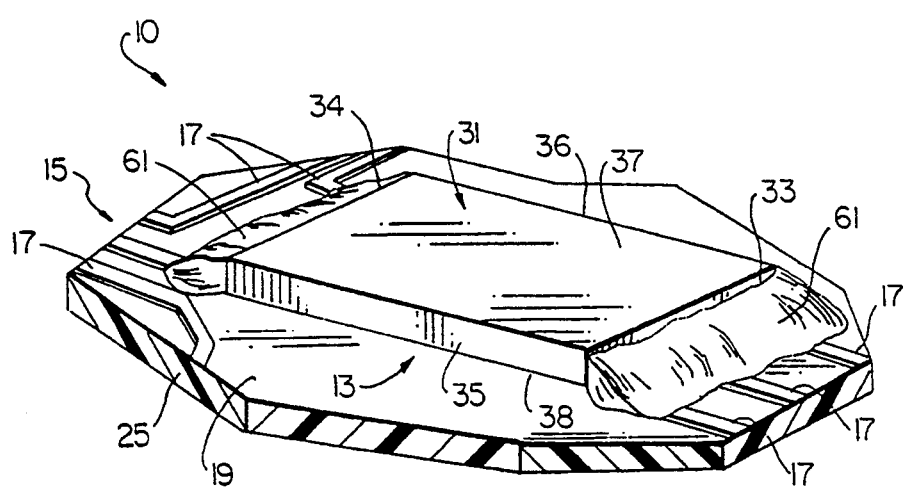
FIG. 2 is a perspective view, similar to FIG. 1, having encapsulant material applied to two opposing sides thereof and onto the electrically conductive leads (not shown) which project from these sides.
Figure 4:
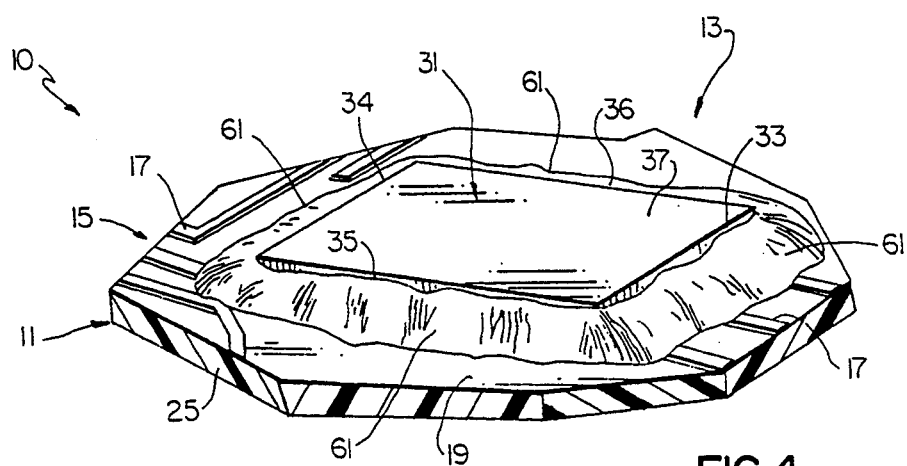
FIG. 4 is a perspective view, similar to the views in FIGS. 1 and 2, showing encapsulant material about the entire periphery (four sides) of the invention's package housing.

Package 13 includes an elongated, electrically insulative housing 31 of known plastic material. The preferred configuration for housing 31 is, as shown in FIGS. 1, 2 and 4, substantially rectangular having a total of four sides 33, 34, 35 and 36. In one example of the invention, housing 31 possessed a length (dimension "L" in FIG. 1) of about 0.750 inch and a width (dimension "W" in FIG. 1) of only about 0.300 inch. The longer sides of housing 31 are thus represented by the numerals 35 and 36, whereas the shorter sides are represented by numerals 33 and 34, each of the shorter sides including a plurality (e.g., eight) of the conductive leads 21 projecting therefrom. The invention is not limited to leads projecting from the two shortened sides as depicted herein, in that leads may also project from the longer sides 35 and 36 for such a package, with no leads projecting from the shorter sides. Alternatively, it is possible that leads may project from all four sides of the package housing.

Of further significance, housing 31 possesses a thickness of from only about 0.030 inch to about 0.050 inch, this thickness represented by the dimension "T" in FIG. 3. Further, housing 31 may be positioned at a slight gap (represented by the dimension "S" in FIG. 3) of only about 0.001 inch to about 0.003 inch from the circuitry 15 on surface 19. In this embodiment, it is thus seen that this relatively flat package occupies a total height of only about 0.033 to about 0.053 inches from the upper surface, including circuitry 17, of substrate 11. Although a small gap is shown in FIG. 2, the invention is also applicable to assemblies wherein the plastic housing of package 13 rests directly on (bottoms out) the upper surface 19 and/or circuitry 15.

In addition to the four sides 33, 34, 35 and 36, the flat package housing 31 also includes relatively planar upper and lower surfaces 37 and 38, respectively.

Package 13 further includes a semiconductor device (chip) located within the plastic housing 31. This semiconductor device is represented, illustratively, by the numeral 41 and is shown in phantom in FIG. 3. Preferably, device 41 is electrically connected to the respective conductive leads 21 (only one shown in FIG. 3) by wire bonding or the like, such a wire being represented by the numeral 43 and shown in phantom in FIG. 3. It is understood that device 41 and wire 43 are shown in FIG. 3 for illustration purposes only and not meant to limit the invention to the location, connection or relative sizes depicted. In such a package, each of the projecting conductive leads 21 is internally coupled to a lead frame or the like (not shown) and individually project from the respective sides of the housing in a manner as shown herein. As such, each of these leads is preferably of the curved configuration particularly shown in FIG. 3, including a terminal end 51 which depends downwardly from the package housing for being positioned on substrate 11. As stated, each conductive lead 21 is designed for being electrically coupled to a respective conductor 17 of substrate 11. Each of the conductive leads 21 of the invention are preferably of copper and have a thickness of only about 0.010 inch, these leads projecting a distance (dimension "PL" in FIG. 2) of only about 0.025 inch from the respective side (34 in FIG. 3) of housing 31.

To assure sound electrical connection between leads 21 and the respective conductor 17, a quantity of solder 53 is applied to substantially cover each mating pair of leads and conductors. That is, a singular quantity of solder is applied to substantially cover one lead and at least a portion of the respective conductor to which lead 21 is electrically coupled. In one example of the invention, each quantity of solder was comprised of 63:37 (tin:lead) solder, this solder is known in the art. It is understood in the drawings that although only one quantity of solder 53 is shown in FIG. 3, that additional quantities are provided to cover the other paired conductor-lead embodiments. Such solder is not shown in FIG. 1 for clarity. It is understood, therefore, that in the embodiment depicted in FIG. 1, a total of sixteen individual quantities of 63:37 solder will be provided. In preferred form, solder 53 is applied to the respective conductor 17 sites in paste form prior to positioning of package 13 on substrate 11. A screening operation is preferably used, following which the package is aligned such that each lead 21 will engage a respective solder paste site. The package and substrate subassembly is then placed within a hot air oven (furnace) and heated to a predetermined temperature to effect solder paste reflow onto the respective leads, the result being the solder configuration as approximately represented in FIG. 3. This preferred temperature for effecting reflow, if using a 63:37 tin:lead solder, is preferably about 185 degrees Celsius (C.). It is understood that this temperature does not adversely affect the package or substrate components. It is understood that the configuration for solder 53 as depicted in FIG. 3 shows the solder to substantially cover the pin 21, almost substantially entirely surrounding the pin. Additionally, the solder 53 is also shown to cover at least a portion of the conductor 17 on substrate 11. Should conductor 17 be in the form of a land or the like element (which in turn may be electrically coupled to a plated-through-hole extending within substrate 11), it is understood that solder 53 will cover a large portion, if not all of this land conductor.

In accordance with the teachings of the invention, a quantity of encapsulant material 61 is applied to the opposing sides 33 and 34 of housing 31 so as to abut against these sides and, most significantly, substantially cover solder 53. Encapsulant material 61, as shown in FIG. 3, substantially surrounds the entire quantity of solder 53 for each of the paired lead-conductor combinations. Encapsulant 61 is not shown in FIG. 1 (for illustration purposes), but is provided in FIG. 2. Encapsulant 61 is applied in liquid form following the aforementioned solder reflow (and solidification) step. In a preferred embodiment, encapsulant 61 is dispensed using at least one syringe. This dispensing of encapsulant preferably occurs following a pre-heating of the substrate 11 and package 31 located thereon for a predetermined time period. Specifically, the substrate having the package soldered in position thereon, is heated to a range of about 65 degrees C. to about 85 degrees C. (in one particular embodiment, to 75 degrees C.) for about one to two hours, the purpose being to drive off any undesirable moisture which may collect within the dielectric material which forms part of substrate 11. A hot air oven is preferably used to accomplish this heating. Subsequently, encapsulant 61 is dispensed while substrate 11 retains much of the heat from this preheating step. Following encapsulant dispense, the board with mounted package and encapsulant is positioned within a hot air oven and heated, significantly, to approximately the glass transition temperature of the dielectric material of substrate 11. In one embodiment of the invention, this temperature was within the range of from about 110 degrees C. to about 140 degrees C., and occurred for a period of from three to four hours. Understandably, encapsulant material 61, applied prior to this heating operation, was applied in liquid form so as to effectively flow about and cover the desired elements as shown in FIG. 3.

A preferred encapsulant material for use in the invention is a polymer resin, and particularly an epoxy. By way of example, such an encapsulant is available from the Dexter Corporation (Olean, N.Y.) and sold under the trade name Hysol FP4510. (Hysol is a registered trademark of the Dexter Corporation.) This encapsulant is a flowable, liquid epoxy material which features low viscosity and low stress, both of said features desirable for use with package structures of the type described herein. When properly cured, such encapsulant material provides a low thermal expansion and high glass transition to assure enhanced protection (e.g., during thermal cycling). Hysol FP4510 possesses a coefficient of linear thermal expansion of about $25 \times 10^{-6}$ inch/inch/degrees C. and a glass transition temperature of 155 degrees C.

The invention is not to be limited to use of the above encapsulant material, however, in that other encapsulants may be successfully used herein. One example of such another encapsulant is Hysol FP4322 having a coefficient of thermal expansion of about $27 \times 10^{-6}$ inch/inch/degrees C. and a glass transition temperature of about 150 degrees C.

It has been discovered that application of encapsulant material of the type described above to the designated locations on assembly 10 has served to significantly increase the operational life of such package assemblies, particularly those of the low profile configuration described above. By way of example, operational life was shown to be extended by a factor of about 2-5 times over package assemblies wherein encapsulant was excluded. Such encapsulant has proven to reinforce the lead-solder bond so as to, significantly, substantially prevent separation between the solder and lead elements, which separation in turn may break the connection therebetween and possibly render at least part of the package assembly 10 inoperative. More specifically, this encapsulant material provides such protection during package assembly operation wherein heat is generated by both the substrate and various package elements (e.g. internal silicon chip).

By way of example, the following illustrate the significant differences in the coefficients of thermal expansion (CTE) of the various elements used in one embodiment of the invention.

| ELEMENT | CTE (x $10^{-6}$ in/in/oC) |
|---|---|
| Organic Substrate (FR-4) | 17-21 |
| Conductive Leads (Copper Alloy) | 45 |
| Chip Encased In Plastic Housing | 7 |
| Solder | 21 |
| Encapsulant | 25 |

Absent such protection afforded by encapsulant material 11, these substantially different coefficients of expansion can result in cracking or similar deformation of the solder-lead joints, such cracking possibly causing failure thereof. The use of encapsulant material of the type defined herein, applied in the manner described herein, has resulted in a much improved package assembly with prolonged life over non-encapsulated assemblies.

Although it is shown in FIG. 3 that encapsulant 61 is spaced a slight distance from the lower part of side 34 of housing 31 (thus forming a gap therebetween), this is not meant to limit the invention. That is, it is also possible in accordance with the teachings herein to dispense encapsulant material 61 under part or all of the under surface of housing 31, assuming of course housing 31 is spaced at a gap such as depicted in FIG. 3. Such partial positioning of encapsulant is shown in phantom in FIG. 3 and represented by the numeral 63.

In FIG. 4, all four sides 33, 34, 35 and 36 of housing 31 are shown to have encapsulant material 61 located thereabout. As stated, only two of these sides (e.g., 33 and 34) will include conductive leads projecting therefrom. However, it has been determined that the addition of encapsulant about this entire outer periphery (all four sides) of the package housing has proven to even further strengthen (reinforce) the aforementioned lead-solder joints. Such added reinforcement is considered accomplished because of the ability of the cured encapsulant material to act against the linear expansion of the package's housing during operation. It has not been determined necessary to provide encapsulant to the top surface 37.

Thus there has been shown and described an improved electronic package assembly wherein encapsulant material is utilized to reinforce the electrical connections formed between the assembly's package elements and the substrate on which this package is positioned. As stated, such a package assembly has exhibited an operational life substantially greater than non-protected package assemblies (those not including encapsulant or the like material). The package assembly as defined herein is capable of being manufactured using mass production techniques and thus benefit from the advantages thereof. Although the invention has been defined with respect to low profile packages (those having a total height of only about 0.030 inch to about 0.050 inch, it is understood that the teachings herein are readily adaptable to other, higher profile package structures, including many of those well known in the art.

While there have been shown and described what are at present the preferred embodiments of the invention, it will be obvious to those skilled in the art that various changes and modifications may be made therein without departing from the scope of the invention as defined by the appended claims.

We claim:

1. A method of making an electronic package assembly, said method comprising:

providing an organic substrate including a surface thereon having a plurality of electrical conductors positioned on said surface;

positioning an electronic package having an elongated, electrically insulative housing having a lower surface and an upper surface and further including first and second opposing sides and first and second pluralities of electrically conductive leads projecting from said first and second opposing sides, respectively, such that said lower surface of said housing is located within 0.003 inch above said surface of said substrate and said conductive leads are electrically connected to respective ones of said electrical conductors on said surface of said substrate;

substantially covering each of said conductive leads and at least a portion of a respective electrical conductor with a quantity of solder, said solder providing an electrical connection between said lead and respective conductor; and substantially covering said solder with encapsulant material and further positioning said encapsulant material against said first and second opposing sides of said housing in an abutting manner, said encapsulant material substantially preventing electrical disconnection between said projecting conductive leads and said solder during operation of said electronic package assembly, said disconnection caused by stresses occurring due to differences in the coefficients of thermal expansion of said organic substrate, solder and conductive leads during said operation, said encapsulant material not being located on said upper surface of said insulative housing.

2. The method according to claim 1 wherein said solder is applied using a screening operation.

3. The method according to claim 2 wherein said solder is applied in paste form and thereafter heated such that said solder will reflow to thereby substantially cover respective pairs of one of said conductive leads and a respective one of said electrical conductors.

4. The method according to claim 1 wherein said organic substrate is heated to a predetermined temperature prior to said substantially covering of said solder with said encapsulant material.

5. The method according to claim 4 wherein said heating is accomplished by placing said organic substrate in a hot air oven for a pre-established time period.

6. The method according to claim 1 wherein said encapsulant material is applied in substantially liquid form and thereafter heated to a pre-established temperature for a predetermined time period sufficient to cure said encapsulant material.

7. The method according to claim 6 wherein said encapsulant material is heated to approximately the glass transition temperature of said organic substrate for said predetermined time period.

8. The method according to claim 7 wherein said pre-established temperature is within the range of from about 110 degrees Celsius to about 140 degrees Celsius.

9. The method according to claim 8 wherein said predetermined time period is from about three to about four hours.

* * * * *